US012635519B2

(12) United States Patent
Burghardt

(10) Patent No.: US 12,635,519 B2
(45) Date of Patent: May 19, 2026

(54) DEVICE COMPRISING A CERAMIC SUBSTRATE AND METHOD FOR PRODUCING SAME

(71) Applicant: Robert Bosch GmbH, Stuttgart (DE)

(72) Inventor: Andreas Burghardt, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 175 days.

(21) Appl. No.: 18/634,630

(22) Filed: Apr. 12, 2024

(65) Prior Publication Data

US 2024/0347417 A1     Oct. 17, 2024

(30) Foreign Application Priority Data

Apr. 14, 2023     (DE) ..................... 10 2023 203 393.3

(51) Int. Cl.
H01L 23/373          (2006.01)
H01L 21/48           (2006.01)
(52) U.S. Cl.
CPC ...... H01L 23/3735 (2013.01); H01L 21/4857 (2013.01)
(58) Field of Classification Search
CPC ......................... H01L 23/3735; H01L 21/4857
USPC ......................................................... 174/255
See application file for complete search history.

(56) References Cited

U.S. PATENT DOCUMENTS

2001/0038140 A1 * 11/2001 Karker ................ H01L 23/3736
                                                                257/E23.105
2021/0068253 A1 * 3/2021 Kato .................... H01L 23/3735

FOREIGN PATENT DOCUMENTS

DE          102021125557 A1     4/2023
EP               1465251 A2    10/2004

* cited by examiner

*Primary Examiner* — Andargie M Aychillhum
(74) *Attorney, Agent, or Firm* — NORTON ROSE FULBRIGHT US LLP

(57)          ABSTRACT

A device including a ceramic substrate having a first side and an opposite second side. A first brazing layer is arranged on the first side in regions and a first copper layer is arranged on the first brazing layer. A second brazing layer is arranged on the second side and a second copper layer is arranged on the second brazing layer. The first copper layer has first trenches which extend from a surface of the first copper layer to the first side. The second copper layer has second trenches which extend from a surface of the second copper layer to at least one surface of the second brazing layer. The second copper layer can be conductively connected to a heat sink. The first trenches have first trench bottoms and the second trenches have second trench bottoms, wherein the first trench bottoms are wider than the second trench bottoms.

6 Claims, 1 Drawing Sheet

DEVICE COMPRISING A CERAMIC SUBSTRATE AND METHOD FOR PRODUCING SAME

FIELD

The present invention relates to a device comprising a ceramic substrate and to a method for producing a device comprising a ceramic substrate.

BACKGROUND INFORMATION

Ceramic circuit substrates are preferably used in power electronics due to the high thermal and mechanical demands. For example, a silicon nitride ceramic with copper applied to both sides is used therein. The copper on the upper side is used for the electrical connection of the electrical components and the copper on the underside is used to equalize thermomechanical stresses during the manufacture and operation of the power electronics. The copper is joined to the silicon nitride ceramic by brazing, wherein a layer of brazing alloy is arranged between the copper and the silicon nitride ceramic in each case. After brazing, trenches are created in the copper layer using a first etching step in order to bring about the electrical circuit on the top side. Such etching trenches can also be made on the underside in order to influence the thermomechanical stresses in the substrate, wherein the trenches have the same width on both the top side and the underside. The brazing layer in the trenches is then removed in a second etching step. The electrical components are arranged on the upper side and the underside is electrically conductively connected to a heat sink. The disadvantage of the etching trenches on the underside is that after joining to the heat sink, cavities, pores, and gaps that may remain in the trenches on the underside of the silicon nitride ceramic and the heat sink can lead to undesirable partial discharges during operation of the power electronics, which can permanently damage the ceramic substrate and the heat sink.

An object of the present invention is to overcome this disadvantage.

SUMMARY

According to an example embodiment of the present invention, a device comprises a ceramic substrate having a first side and a second side, wherein the first side is opposite the second side. A first brazing layer is arranged in some regions on the first side, wherein a first copper layer is arranged on the first brazing layer. A second brazing layer is arranged on the second side and a second copper layer is arranged on the second brazing layer. The first copper layer has first trenches extending from a surface of the first copper layer to the first side. The second copper layer has second trenches which extend from a surface of the second copper layer to at least one surface of the second brazing layer, and the second copper layer can be conductively connected or is conductively connected to a heat sink. According to the present invention, the first trenches have first trench bottoms and the second trenches have second trench bottoms, wherein the first trench bottoms are wider than the second trench bottoms.

An advantage here is that no partial discharges occur between the ceramic substrate and the heat sink when a voltage is applied to the first side of the substrate to operate the semiconductor components. Furthermore, it is advantageous that the thermomechanically induced warping of the ceramic substrate can be reduced by a corresponding design of the second, narrow etching trenches.

In a further development of the present invention, the second trenches extend up to the surface of the second brazing layer.

An advantage here is that no partial discharges occur between the ceramic substrate and the heat sink.

In one example embodiment of the present invention, the first trench bottoms have a width of at least 0.5 mm.

An advantage here is that the electrical insulation between the individual components is guaranteed for applications above 2400 V.

In one example embodiment of the present invention, the ceramic substrate comprises $Si_3N_4$, AlN, $Al_2O_3$, or aluminum.

An advantage here is that the brazing process can be used to join the copper layers to the ceramic substrate.

In a further example embodiment of the present invention, the first copper layer and the second copper layer each have a layer thickness of at least 0.3 mm.

An advantage here is that the costs are low.

In a further development of the present invention, the heat sink can be joined to the second copper layer using a soft solder.

An advantage here is that the second brazing layer can be wetted with the liquid soft solder, creating a material bond.

A method according to an example embodiment of the present invention for producing a device comprising a ceramic substrate having a first side and a second side, wherein the first side is opposite the second side, comprises applying a first copper layer to the first side and a second copper layer to the second side by brazing. The method further comprises forming first trenches and second trenches by copper etching, wherein the first trenches extend from a surface of the first copper layer to a surface of the first brazing layer, and the second trenches extend from a surface of the second copper layer to a surface of the second brazing layer, wherein the first trenches have first trench bottoms and the second trenches have second trench bottoms, wherein the first trench bottoms are wider than the second trench bottoms. The method further comprises removing at least the first brazing layer below the first trench bottoms by brazing.

Further advantages can be found in the following description of exemplary embodiments in the rest of the disclosure herein.

BRIEF DESCRIPTION OF THE DRAWINGS

The present invention is explained below with reference to preferred embodiments and the figures.

DETAILED DESCRIPTION OF EXAMPLE EMBODIMENTS

Figures 1, 2:
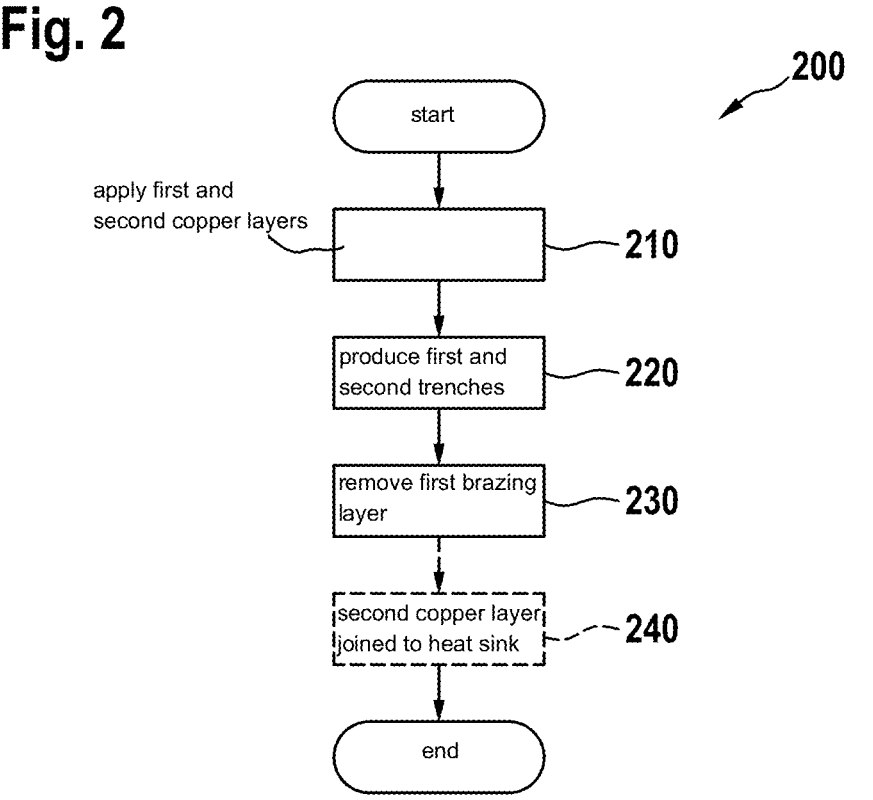
FIG. 1 shows a device according to the an example embodiment of the present invention comprising a ceramic substrate joined to a heat sink.
FIG. 2 shows a method according to an example embodiment of the present invention for producing a ceramic substrate which can be joined to a heat sink.

FIG. 1 shows a device 100 comprising a ceramic substrate 101. The ceramic substrate 101 has a first side and a second side, wherein the first side is opposite the second side. A first brazing layer 102 is arranged in some regions on the first side. A first copper layer 103 is arranged on the first brazing layer 102. A second brazing layer 104 is arranged on the second side. A second copper layer 105 is arranged on the second brazing layer 104. The first copper layer 103 has first trenches extending from a surface of the first copper layer 103 to the first side. The second copper layer has second trenches extending from a surface of the second copper layer to at least a surface of the second brazing layer 104. The first trenches have first trench bottoms and the second trenches have second trench bottoms, wherein the first trench bottoms are wider than the second trench bottoms. The first trench bottoms have a width of at least 0.5 mm. The second copper layer 105 can be joined to a heat sink 106 in a thermally conductive manner via a connecting layer 107. Alternatively, the second copper layer 105 is joined to the heat sink 106 in a thermally conductive manner via the connecting layer 107. The connecting layer 107 comprises, for example, a soft solder, a sintered layer, or an adhesive. The heat sink is, for example, a metal heat sink.

The ceramic substrate 101 comprises materials that can be joined to a metal layer, in particular to copper, by means of a brazing process, or active metal brazing, referred to as the AMB process. The ceramic substrate 101 here comprises for example $Si_3N_4$, AlN, $Al_2O_3$, or aluminum.

The first copper layer 103 and the second copper layer 105 preferably have layer thicknesses of 0.3 mm, 0.4 mm, 0.5 mm or 0.8 mm, in particular 0.4 mm.

The first brazing layer 102 and the second brazing layer 104 each have a layer thickness of between 1 μm and 20 μm.

A plurality of electrical components 108 can be arranged on the first copper layer 103.

In a first exemplary embodiment, the second trenches extend to the surface of the second brazing layer 104. This means that there is a continuous conductive layer on the second side of the ceramic substrate 101, i.e. underneath the ceramic substrate. Due to the continuous conductive layer, no partial discharges occur between the ceramic substrate 101 and the heat sink 106 during operation of the power electronics.

In a second exemplary embodiment, the second trenches extend into the second brazing layer 104. This means that there is a continuous conductive layer on the second side of the ceramic substrate 101. However, it has a lower height or layer thickness than in the first exemplary embodiment. Here, too, no partial discharges occur between the ceramic substrate 101 and the heat sink 106 during operation of the power electronics.

In a third exemplary embodiment, the second trenches extend up to the second side. This means that there is no continuous conductive layer on the second side of the ceramic substrate 101. Alternatively, due to process variations, the second brazing layer 104 may be completely removed only in some second trenches. The regions of the ceramic substrate 101 exposed thereby have a very narrow width. Due to the non-continuous conductive layer, weak partial discharges occur during operation, but these are harmless for the device due to the small width of the second trenches.

The device 100 is used, for example, in the power electronics of an inverter or a rectifier.

FIG. 2 shows a method 200 for producing a device comprising a ceramic substrate having a first side and a second side, wherein the first side is opposite the second side. The method 200 starts with a step 210 in which a first copper layer is applied to the first side and a second copper layer is applied to the second side by brazing. The brazing takes place at temperatures above 750° C. In a following step 220, first trenches and second trenches are produced by copper etching, wherein the first trenches extend from a surface of the first copper layer to a surface of the first brazing layer, and the second trenches extend from a surface of the second copper layer to a surface of the second brazing layer, wherein the first trenches have first trench bottoms and the second trenches have second trench bottoms, wherein the first trench bottoms are wider than the second trench bottoms. The etching edges in the copper layers are slanted. In a subsequent step 230, at least the first brazing layer below the first trench bottoms is removed by braze etching. In the second trenches, the second brazing layer is not removed or is not completely removed, since the mass transfer in the narrow second trenches is lower than in the wide first trenches. This means that the ceramic substrate has completely etched structures in the copper, i.e. over the entire height of the copper. On the first side, the first brazing layer is completely removed so that electrical insulation is ensured for the electrical components. On the second side, the structures have brazing or brazing residues in the second trench bottoms. In other words, the narrower trench bottom width of the second trenches has the result that the brazing alloy is not completely removed in the second etching step due to the slowed mass transfer in the narrow trenches, and that electrical conductivity is maintained continuously over the entire surface, whereas in the first, wider etching trenches the brazing alloy is completely removed in order to ensure electrical insulation of the various copper regions. The ideal second trench bottom width, in which the copper is completely removed during copper etching but the brazing alloy is at least not completely removed during the braze etching, depends on the thicknesses of the first and second copper layers, the strength of the etching bath, and the flow conditions in the etching bath. The thermomechanical warping behavior is not significantly determined by the trench bottom width on the second side, and can be advantageously influenced by a suitable design of the length and position of the second trenches depending on the number and position of the components subject to power dissipation on the first side.

In a subsequent optional step 240, the second copper layer is joined to a heat sink by soldering, adhesive bonding, or sintering, in particular by soft soldering. In its liquid state, the soft solder wets the exposed second brazing layer so that no air gaps occur between the dielectric ceramic substrate and the heat sink. If the second brazing layer is removed completely in isolated cases due to process fluctuations in step 230, at least the strength of the possible partial discharges during operation of the electrical components is reduced due to the smaller air gaps, as a result of which the substrate ceramic and the heat sink are not impaired.

The invention claimed is:

1. A device, comprising:
    a ceramic substrate having a first side and a second side, wherein the first side is opposite the second side;
    a first brazing layer arranged on the first side in regions;
    a first copper layer is arranged on the first brazing layer;
    a second brazing layer arranged on the second side; and
    a second copper layer arranged on the second brazing layer;
    wherein the first copper layer has first trenches which extend from a surface of the first copper layer to the first side, the second copper layer has second trenches which extend from a surface of the second copper layer to at least one surface of the second brazing layer, wherein the second copper layer can be conductively connected to a heat sink; and wherein the first trenches have first trench bottoms and the second trenches have second trench bottoms, wherein the first trench bottoms are wider than the second trench bottoms;

wherein the second trenches extend up to the surface of the second brazing layer; and wherein the first trench bottoms have a width of at least 0.5 mm.

2. The device according to claim 1, wherein the first trench bottoms have a width of at least 0.5 mm.

3. The device according to claim 1, wherein the ceramic substrate includes $Si_3N_4$, or AlN, or $Al_2O_3$, or aluminum.

4. The device according to claim 1, wherein the first copper layer and the second copper layer each have a layer thickness of at least 0.3 mm.

5. The device according to claim 1, wherein the heat sink can be joined to the second copper layer using a soft solder.

6. A method for producing a device including a ceramic substrate having a first side and a second side, wherein the first side is opposite the second side, the method comprising the following steps:

applying a first copper layer to the first side and of a second copper layer to the second side using brazing;

producing first trenches and second trenches by copper etching, wherein the first trenches extend from a surface of the first copper layer to a surface of the first brazing layer, and the second trenches extend from a surface of the second copper layer to a surface of the second brazing layer, wherein the first trenches have first trench bottoms and the second trenches have second trench bottoms, wherein the first trench bottoms are wider than the second trench bottoms; and removing at least the first brazing layer below the first trench bottoms by braze etching.

* * * * *